(12) United States Patent
Ramasubramanian et al.

(10) Patent No.: US 11,913,995 B2
(45) Date of Patent: Feb. 27, 2024

(54) METHOD OF DETERMINING THE STATE OF CHARGE OF A BATTERY USED IN AN ELECTRIC VEHICLE

(71) Applicant: Karma Automotive LLC, Irvine, CA (US)

(72) Inventors: Suvrat Ramasubramanian, Costa Mesa, CA (US); Ali Jokar, Irvine, CA (US); Jing Hong, Trabuco Canyon, CA (US)

(73) Assignee: Karma Automotive LLC, Irvine, CA (US)

( * ) Notice: Subject to any disclaimer, the term of this patent is extended or adjusted under 35 U.S.C. 154(b) by 0 days.

(21) Appl. No.: 17/664,357

(22) Filed: May 20, 2022

(65) Prior Publication Data

US 2022/0276309 A1 Sep. 1, 2022

Related U.S. Application Data

(63) Continuation of application No. 16/808,142, filed on Mar. 3, 2020, now Pat. No. 11,360,147.

(51) Int. Cl.
*G01R 31/367* (2019.01)
*G01R 31/3835* (2019.01)

(52) U.S. Cl.
CPC ....... *G01R 31/367* (2019.01); *G01R 31/3835* (2019.01)

(58) Field of Classification Search
CPC .... G01R 31/367; G01R 31/3835; Y02T 10/70
See application file for complete search history.

(56) References Cited

U.S. PATENT DOCUMENTS 7,233,128 B2 6/2007 Brost et al.
9,329,240 B2 5/2016 Baba et al.
(Continued)

FOREIGN PATENT DOCUMENTS

CN 104573294 A 4/2015
CN 110596593 A 12/2019
(Continued)

OTHER PUBLICATIONS

Z. Chen, Y. Fu and C. C. Mi, "State of Charge Estimation of Lithium-Ion Batteries in Electric Drive Vehicles Using Extended Kalman Filtering," in IEEE Transactions on Vehicular Technology, vol. 62, No. 3, pp. 1020-1030, Mar. 2013, doi: 10.1109/TVT.2012.2235474. (Year: 2017).*

(Continued)

*Primary Examiner* — Stacy Whitmore
(74) *Attorney, Agent, or Firm* — Honigman LLP

(57) ABSTRACT

A method of determining the state of charge (SOC) of a battery. The method includes receiving battery parameters for a battery, and based on the received battery parameters for the battery, determining an estimated voltage of the battery and determining an estimated SOC of the battery. The method also includes receiving a measured voltage of the battery, determining a voltage error value based on the measured voltage of the battery and the estimated voltage of the battery, correcting, using the voltage error, the estimated SOC to determine a corrected SOC for the battery, and operating the battery based on the corrected SOC.

18 Claims, 4 Drawing Sheets

(56) References Cited

U.S. PATENT DOCUMENTS

| | | | |
|---|---|---|---|
| 2006/0181245 A1* | 8/2006 | Mizuno | G01R 31/367 |
| | | | 320/132 |
| 2014/0210418 A1 | 7/2014 | Wang et al. | |
| 2014/0214348 A1 | 7/2014 | Sahinoglu et al. | |
| 2015/0142226 A1 | 5/2015 | Jung et al. | |
| 2015/0287222 A1 | 10/2015 | Zhao et al. | |
| 2016/0124051 A1* | 5/2016 | Prasad | G01R 31/367 |
| | | | 324/426 |
| 2017/0168119 A1* | 6/2017 | Tagade | G01R 35/005 |
| 2017/0205469 A1* | 7/2017 | Song | G01R 31/392 |
| 2018/0017628 A1* | 1/2018 | Takegami | H01M 10/44 |
| 2018/0143254 A1* | 5/2018 | Kim | G01R 31/3648 |
| 2018/0292463 A1* | 10/2018 | Canals Esteve | G01R 31/367 |
| 2019/0064276 A1 | 2/2019 | Kawai et al. | |
| 2019/0137573 A1* | 5/2019 | Hatano | G01R 31/36 |
| 2019/0170827 A1 | 6/2019 | Shoa Hassani Lashidani | |
| 2019/0339333 A1* | 11/2019 | Gelso | G01R 31/3835 |
| 2020/0018797 A1* | 1/2020 | Gelso | B60L 58/12 |
| 2020/0124676 A1* | 4/2020 | Tohara | H02J 7/0013 |
| 2020/0132782 A1* | 4/2020 | Hong | H01M 10/48 |
| 2020/0309860 A1* | 10/2020 | Arima | H01M 10/052 |
| 2021/0055348 A1* | 2/2021 | Kim | G01R 31/367 |
| 2021/0066945 A1* | 3/2021 | Jung | H01M 10/052 |
| 2021/0080506 A1* | 3/2021 | Wampler | H01M 10/48 |
| 2021/0116510 A1* | 4/2021 | Kim | G01R 31/3842 |
| 2021/0263107 A1* | 8/2021 | Kim | G01R 31/374 |
| 2021/0316636 A1* | 10/2021 | Gelso | B60L 58/12 |
| 2022/0006313 A1* | 1/2022 | Lim | G01R 31/367 |
| 2022/0179002 A1* | 6/2022 | Kim | G01R 31/3842 |
| 2022/0237342 A1* | 7/2022 | Sato | G01R 31/385 |
| 2022/0283227 A1* | 9/2022 | Kim | G01R 31/392 |
| 2022/0299571 A1* | 9/2022 | Kitamura | G01R 31/3842 |
| 2023/0065968 A1* | 3/2023 | Nishikawa | G01R 31/374 |
| 2023/0179002 A1* | 6/2023 | Tyagi | H02J 7/0016 |
| | | | 320/107 |
| 2023/0194616 A1* | 6/2023 | Lee | H02J 7/007182 |
| | | | 324/426 |

FOREIGN PATENT DOCUMENTS

| | | | | |
|---|---|---|---|---|
| CN | 111505506 A | | 8/2020 | |
| JP | 2018-077199 A | | 5/2018 | |
| KR | 10-2019-0140268 A | | 12/2019 | |
| WO | WO-2020057721 A1 | * | 3/2020 | B60L 58/12 |

OTHER PUBLICATIONS

V. Sangwan, V. R. Vakacharla, R. Kumar and A. K. Rathore, "Estimation of state of charge for Li-ion battery using model adaptive extended Kalman filter," 2017 7th International Conference on Power Systems (ICPS), Pune, India, 2017, pp. 726-731, doi: 10.1109/ICPES.2017.8387385. (Year: 2017).*

USPTO, Office Action related to U.S. Appl. No. 16/808,142, dated Sep. 17, 2021.

International Search Report and Written Opinion dated Jun. 4, 2021 issued by the Korean Intellectual Property Office in related International Application No. PCT/US2021/020652; filed Mar. 3, 2021.

Eric A. Wan et al.; "The Unscented Kalman Filter For Nonlinear Estimation"; Oregon Graduate Institute of Science & Technology; National Science Foundation; Grant No. IRI-9712346; (2013, cited at class syllabus https://www.seas.harvard.edu/courses/cs281/).

* cited by examiner

METHOD OF DETERMINING THE STATE OF CHARGE OF A BATTERY USED IN AN ELECTRIC VEHICLE

CROSS REFERENCE TO PRIOR APPLICATIONS

This U.S. patent application is a continuation of, and claims priority under 35 U.S.C. § 120 from, U.S. patent application Ser. No. 16/808,142, filed on Mar. 3, 2020. The disclosure of this prior application is considered part of the disclosure of this application and is hereby incorporated by reference in its entirety.

TECHNICAL FIELD

This disclosure relates to the field of batteries used in electric vehicles (EV).

BACKGROUND

The present disclosure relates to a method for determining the state of charge of a battery.

Batteries are used as the source of energy for many electrical systems, especially in hybrid electric vehicles (HEVs) and electric vehicles (EVs). In these vehicles, the battery interacts with other components by means of a Battery Management System (BMS) to provide power to the vehicle and meet the vehicle's energy demand while maintaining the safety of the electrical system. The battery is typically a high voltage (HV) battery. Plug-in Hybrid Electric Vehicles (PHEV, HEV) and full electric vehicles depend on the battery as a secondary and primary source of energy, respectively, to propel the vehicle. Therefore, it is imperative to track the available energy from the battery to prevent the battery from overcharging or under discharging. To ensure a safe and maximum utilization of the available energy from the battery, such vehicles employ a BMS that controls the functioning of the battery and determines its performance.

The reliability of these electrical systems is highly dependent of the health and safety of the battery, and therefore on the ability of the BMS to provide operation data that allows for peak performance without jeopardizing the health and safety of the battery. Controlling and monitoring a battery installed in an HEV or EV is much more challenging without a fast and accurate model of the battery to be used by the BMS. Models are used for estimating metrics of the battery, including state-of-charge (SOC), state-of-health (SOH), state-of-energy (SOE) and state-of-power (SOP). Also, the models are employed to help BMSs with the functions of battery control, real-time observation, parameter estimation, and optimization of the battery.

The State of Charge (SOC) gives a measure of the remaining usable capacity of the battery in real time as the battery is charged through external charging or regen mechanism and discharged during driving. The SOC determines the capability of the battery to provide the required energy and accurate estimation of the SOC prevents the degradation of the battery as a result of excess charge and discharge. Typically, the SOC is the ratio of the current battery capacity to the maximum batter capacity.

It is important that the BMS accurately determine the battery state of charge in real time. By doing so, the BMS can ensure maximum performance output from the battery while minimizing effects that shorten of life of the battery.

The BMS should be able to estimate the state of charge of the battery in any given condition. If the SOC determined by the BMS is inaccurate, for example, if the SOC is underestimated, this may result in overcharge of the battery. The overcharging of the battery could create dangerous events such as thermal runaway of the battery. On the other hand, if the SOC is overestimated, the overall capability of the battery will be limited thereby affecting the performance and allowing for less energy to be drawn from the battery.

The typical method of determining the SOC is based on the integral of the current over a period, times the inverse of the remaining capacity of the battery. Other methods of determining the SOC use the estimation technique such as Kalman filters, extended Kalman filter (EKF) suffer from limitations due to estimating the non-linear behavior of the battery (KF) and/or inaccuracies due to the linearization methodology employed (EKF). Furthermore, advanced methods such as learning algorithms (e.g., machine learning, neural networks) have high computational complexity that cannot be applied in real time for estimation of the SOC.

It would be desirable to find a method of determining the SOC that including using a non-linear data modeling and providing updates in real time.

SUMMARY

An aspect of the disclosure provides a method of determining the state of charge (SOC) of a battery used to provide power for propulsion of an electric vehicle. The method includes the steps of: establishing an initial value for the SOC and a noise covariance error, generating updated sigma points for a best estimate of the SOC and a noise covariance error matrix, determining the SOC based on a nonlinear battery model that is updated over a predetermined time interval that uses a Kalman filter and the SOC is based on the measurement error of the battery voltage and gain of the Kalman filter, computing an update of the covariance error matrix based on innovation sequence related to an error associated with the predicting battery voltage and the innovation sequence is known as normalized innovation squared (NIS) sequence, performing a consistency check of the NIS sequence by checking whether the NIS sequence lies within a predetermined confidence bounds, updating the covariance error if the consistency check of the NIS sequence determines that the NIS sequence lies outside of the confidence bounds, and repeating the aforementioned steps after the predetermined time interval has elapsed.

Implementations of the disclosure may include one or more of the following optional features. In some implementations, the method uses battery parameters based on two branch RC model for performance of the battery.

DESCRIPTION OF DRAWINGS

The features, objects, and advantages of the present disclosure will become more apparent from the detailed description set forth below when taken in conjunction with the drawings in which like reference characters identify correspondingly throughout and wherein.

DETAILED DESCRIPTION

As used herein, the terms "a" or "an" shall mean one or more than one. The term "plurality" shall mean two or more than two. The term "another" is defined as a second or more. The terms "including" and/or "having" are open ended. The term "or" as used herein is to be interpreted as inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

As used herein, vector notations are defined as follows:

$$\dot{x} = \frac{\partial}{\partial t} x$$

$$\hat{x} = \operatorname{mean}(x)$$

$$\tilde{x} = \operatorname{mean}(x)$$

Reference throughout this document to "one implementation," "certain implementations," "an implementation," or similar term means that a particular feature, structure, or characteristic described in connection with the implementation is included in at least one implementation. Thus, the appearances of such phrases in various places throughout this specification are not necessarily all referring to the same implementation. Furthermore, the particular features, structures, or characteristics may be combined in any suitable manner on one or more implementations without limitation.

As required, detailed implementations of the present disclosure are disclosed herein; however, it is to be understood that the disclosed implementations are merely exemplary of the disclosure that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present disclosure.

Figure 1:
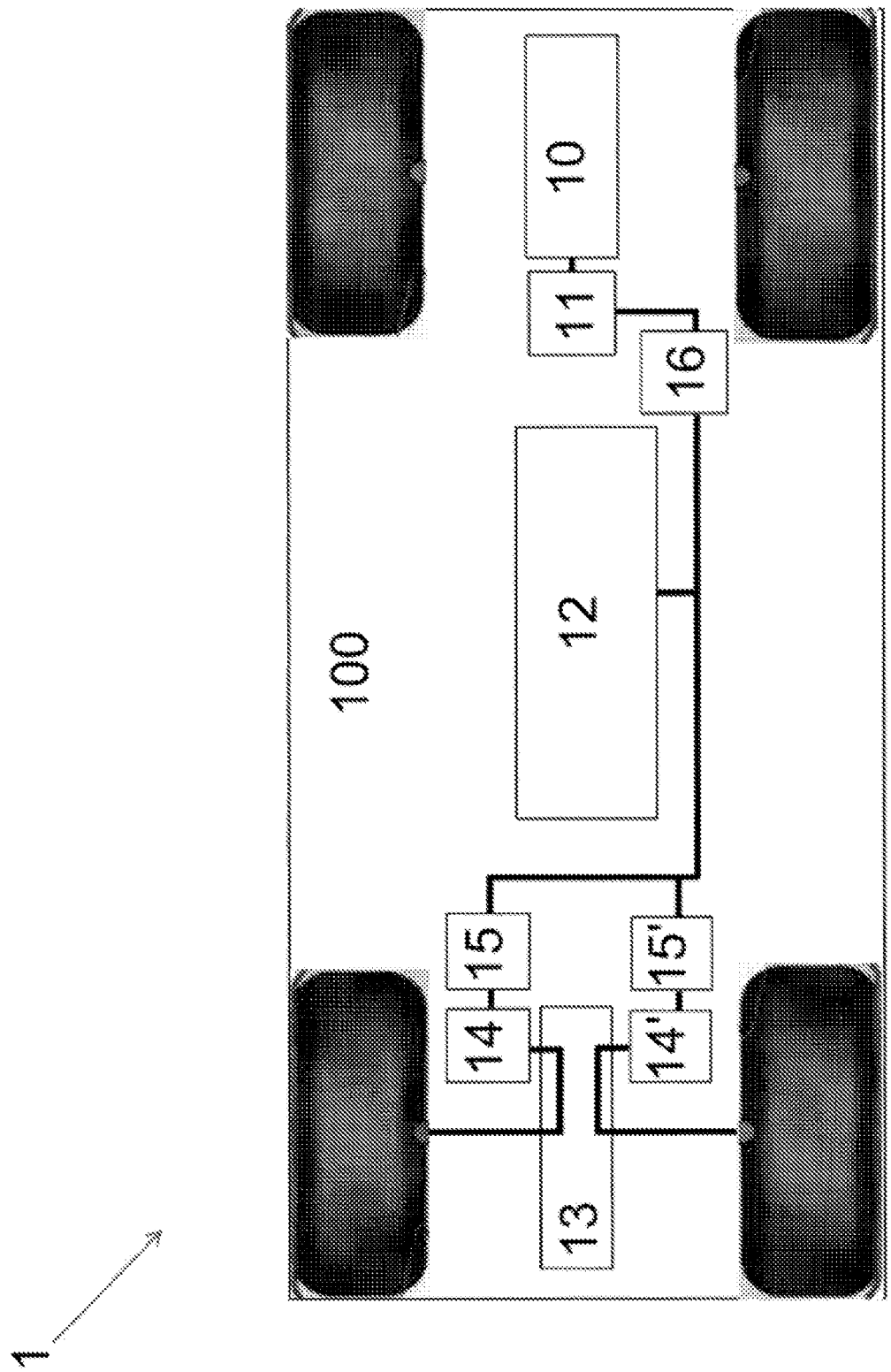
FIG. 1 is an electric vehicle with an exemplary drivetrain including a battery.

FIG. 1 shows an exemplary electric vehicle 1 with a drivetrain 100. The exemplary vehicle includes an internal combustion engine 10, a generator 11, and one or more electric motors for driving rotation of the wheels of the vehicle. The internal combustion engine 10 drives the generator 11 to produce electrical power for a battery 12 and the motors 14/14'. A generator inverter 16 for the generator 11 may also be provided. A gearbox 13 is provided to provide the required drive ratio for the vehicle. Power to the motor is communicated via inverters 15/15', which transforms DC power provided to the AC power required by the motors 14/14'. The inverters 15/15' may include multiple phases corresponding to each phase of the motors 14/14'. The system and method described below may be used in conjunction with a battery such as the battery 12 shown in FIG. 1.

Figure 2:
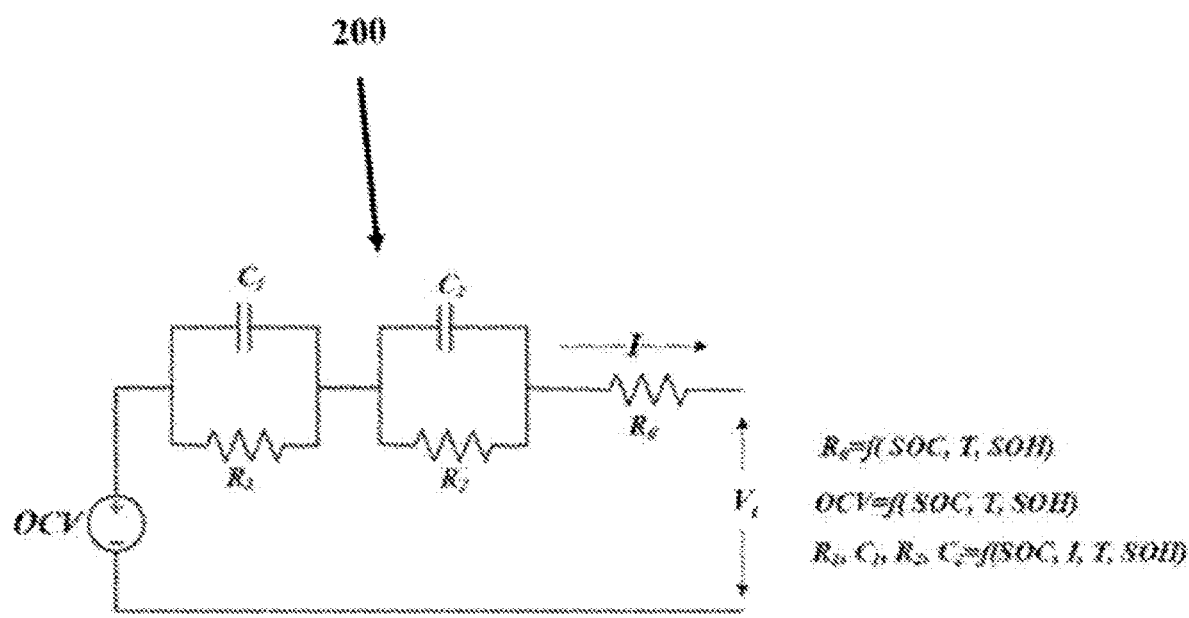
FIG. 2 is a simplified circuit diagram of an exemplary implementation of a two branch RC model equivalent circuit for a battery.

In one implementation, the estimation method of determining the SOC uses the battery parameters based on a 2'd-order RC equivalent circuit model of the battery (e.g., as shown in FIG. 2) and estimates the voltage based on the circuit model. FIG. 2 is a circuit diagram depicting an exemplary implementation of a RC model 200 for use in the SOC estimation method 300. In one implementation, all RC parameters (including but not limited to Ro, C1, RI, C2, R2, and Open Circuit Voltage (OCV)) may be generated by fitting the parameter with data obtained from tests performed on the battery cell 215. In one implementation, Ro is determined as a function of the state of charge (SOC) of the battery cell 215, the battery cell 215 temperature T cell, and the state of health (SOH) of the battery cell 215. In one implementation, OCV is determined as a function of the state of charge (SOC) of the battery cell 215, the battery cell 215 temperature Tceii, and the state of health (SOH) of the battery cell 200. In one implementation, C1, RI, C2, and R2 are determined as a function of the state of charge (SOC) of the battery cell 215, the equivalent circuit current I, the battery cell 215 temperature T cell, and the state of health (SOH) of the battery cell 200.

Figure 3:
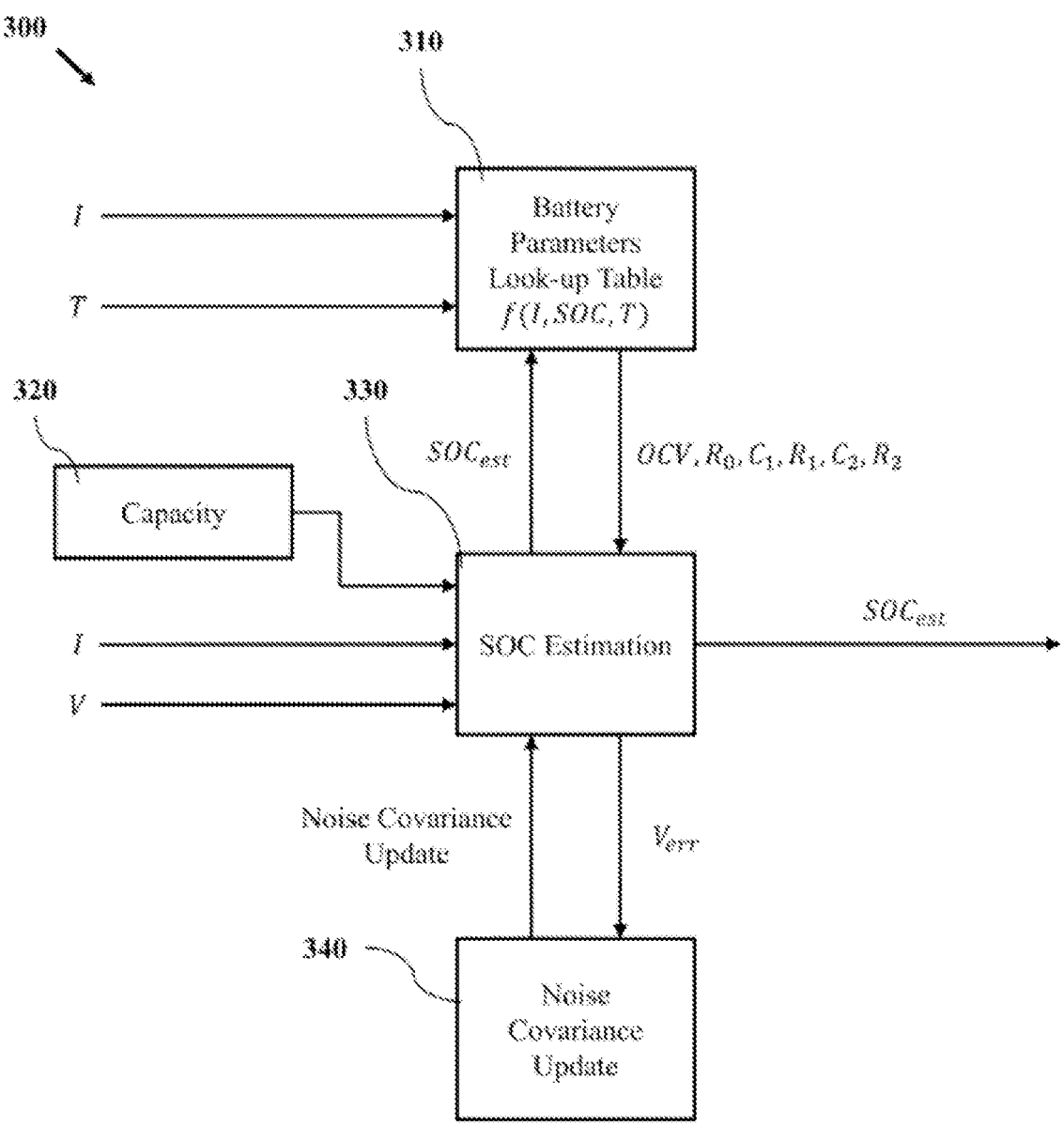
FIG. 3 is a block diagram of a Battery Management System that includes a controller and a plurality of modules for carrying out a method of estimating the state of charge of a battery.

FIG. 3 is a block diagram of a plurality of modules that may be employed in the BMS 300 for carrying out the method of determining or estimating the SOC for a vehicle battery. The system includes a controller that includes a SOC estimation module 330. The system also includes look up tables for various battery parameters that may be created and stored in a Look-up Table module 310. The system may further include a module 320 for estimating or determining the remaining capacity of the battery based on the SOH of the battery. Further, the system includes a module 340 for performing a Noise Covariance Update of the SOC estimation. Where the term covariance refers to the joint variability of two or more random variables.

The aforementioned modules may be integrated into a single controller or microprocessor. Alternatively, one or more of the modules may be packaged separately in one or more microprocessor or controller.

The system is configured to make a probabilistic determination or estimation of the state of charge (SOC) based on the innovation sequence (the difference between the observed value of a variable and the optimal forecast of that value based on prior information) given by the voltage estimation error and corrects the SOC calculated by the model equation. The method of determining the SOC involves two "update" steps for estimating the battery voltage and determining the SOC. The first update step is a measurement update, where the model predicts the state of charge and battery voltage based on the variance of the estimated value from the true value. The second update step is a time update of the prediction based on the innovation error computed from the voltage estimation error to correct the predicted state of charge.

The method of determining the SOC may employ a transformation technique that linearizes the nonlinear model used in this method by converging close to the measured value and thereby estimating the state of charge accurately without affecting the computation time and load on the system. The transformation technique employs an adaptive unscented Kalman filter (UKF) based on a technique called the unscented transform for linearizing the nonlinear model equation, wherein an initial point determines the probability of the convergence of the estimation.

Additionally, the method for determining the SOC may employ a methodology known as a normalized innovation sequence (NIS) to update the noise covariance matrix that measures the deviation of the estimate due to additive noise that may not be Gaussian in nature (whereas UKF assumes that the noise present in the system is Gaussian). The use of the NIS enables the model of the battery capacity to adapt to the changing noise covariance and update the state vector.

The estimation method of determining the SOC additionally updates the noise covariance of the estimated states by adapting to the estimation error (known as "innovation sequence") based on the moving average error method. The update ensures that the method is robust and estimates the state (i.e., the SOC) accurately.

Figure 4:
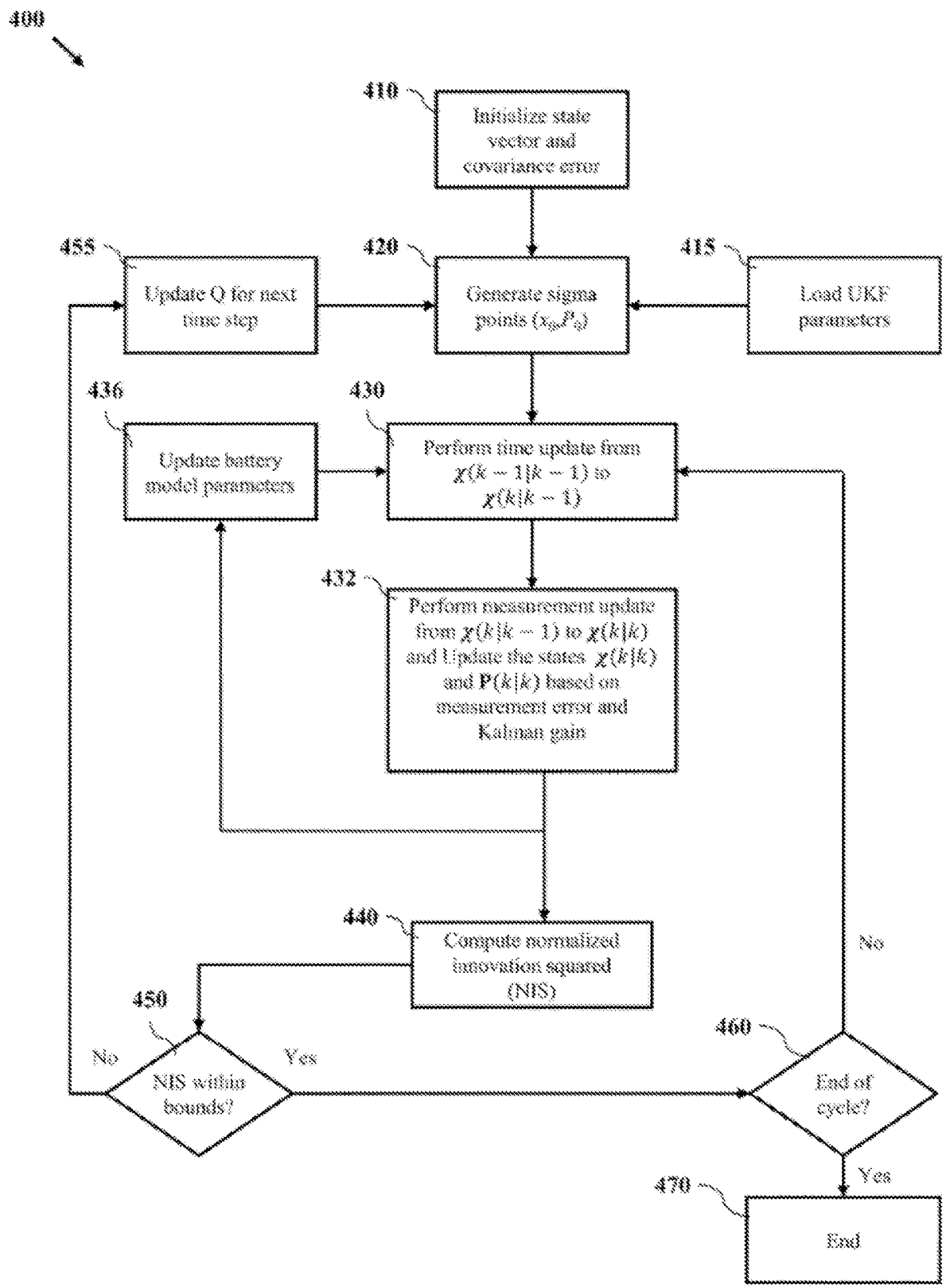
FIG. 4 is a flow chart of the method performed by the controller and modules of FIG. 3.

FIG. 4 shows a flow chart of a method of estimation the SOC performed by the BMS 300 system show in simplified form in FIG. 3. As a first step of the method the system establishes an initial value of the SOC and of a covariance error Q in step 410.

In step 420, the method generates updated sigma points for the SOC ($x_0$) and the covariance ($P_o$). The updates are generated using the following equations.

$$\hat{x}_0 = E[x_0]$$

$$P_0 = E[(x_0 - \hat{x}_0)(x_0 - \hat{x}_0)^T] \forall k \notin \{1, \ldots, \infty\}$$

In step 430 the system performs a time update of the sigma points using the following equation.

$$X_{k-1} = [\hat{x}_{k-1}(\hat{x}_{k-1} + \gamma\sqrt{P_{k-1}})(\hat{x}_{k-1} - \gamma\sqrt{P_{k-1}})]$$

where $E[x_0]$ is the expected value of $x_0$; $\gamma = \sqrt{n+\lambda}$; $\lambda = \alpha^2 (L+k) - L$; $\alpha$, $k$ are the scaling parameters; $L = 2n+1$ sigma points; and n is number of state variables (in the primary implementation, n=3).

$$\dot{X}_k = f(X_{k-1}, u_k) \quad (1)$$

$$y_k = V_{ocv,k}(SOC_k, T_k) V_{rc1,k} + V_{rc2,k} + I_k R_{0,k}$$

where equation (1) is the state space equation which consists of equations for each state variable and using $X_{k-1}$ as sigma points at the previous time step, $y_k$ is the predicted voltage, $u_k$ is the control vector representing data measurements taken at time k, $V_{ocv,k}$ is determined from a look-up table, $R_{0,k}$ is a function of SOC, temperature and current and where f determines the updated values for $\dot{X}_k$ as follows:

$$\hat{x}_k = [SOC_k, V_{rc1,k}, V_{rc2,k}]$$

$$u_k = \left[\frac{I_k \Delta t}{Ah * 3600}, I_k R_1 * \left(1 - e^{\frac{-\Delta t}{\tau_1}}\right), I_k R_2 * \left(1 - e^{\frac{-\Delta t}{\tau_2}}\right)\right]$$

$$SOC_k = SOC_{k-1} + \frac{I_k \Delta t}{Ah * 3600}$$

$$V_{rc1,k} = V_{rc1,k-1} * \left(e^{\frac{-\Delta t}{\tau_1}}\right) + I_k R_1 * \left(1 - e^{\frac{-\Delta t}{\tau_1}}\right)$$

$$V_{rc2,k} = V_{rc2,k-1} * \left(e^{\frac{-\Delta t}{\tau_2}}\right) + I_k R_2 * \left(1 - e^{\frac{-\Delta t}{\tau_2}}\right)$$

where time constant $\tau_1 = R_1 C_1$, time constant $\tau_2 = R_2 C_2$, and all the RC parameters are input from the RC model lookup tables and Ah is the battery cell capacity. Equation (1) predicts the change in value $\dot{X}_k$ for each sigma point $X_k$ at next time step as a function of the sigma points computed on states at current time step, acting on the input at current time step. Equation (2) is the output equation which is the equation for estimated voltage, which is then used for updating the estimated state variables.

It should be noted that, as shown in block 415, that the system is configured to generate the sigma points based on the UKF parameters (e.g., alpha, beta, gamma, Weights (W_c, W_m)).

In step 432, the system is configured to perform a measurement update and update the states based on the measurement error and Kalman gain using the following equation:

$$\tilde{x}_k = \hat{x}_k + K(V_{measured} - y_k)$$

where $\tilde{x}_k$ is the corrected state, K is the Kalman gain (a weight function ranging between 0 and 1 indicating how much weight to assign to a predicted value versus a measured value) and $V_{measured}$ is the cell voltage measured by a sensor.

In step 440, the update of the covariance matrix is made based on the innovation sequence of the system which is otherwise known as the error e in the voltage prediction. As shown in FIG. 3, the module 340 performs a consistency check of a NIS sequence as described below. The consistency check utilizes the following equations:

$$e = V_{measured} - y_k$$

$$Q_{process} = KE[ee^T]K^T$$

where $Q_{process}$ is the covariance of the process noise.

The measurement error is squared and normalized to give a sequence which is used to check for the consistency of the determination of the SOC made by the controller. In step 440, this sequence is known as normalized innovation squared (NIS) and is given by, $$NIS_k = e_k S_k^{-1} e_k^T$$

where k is the time step, e is the error and S is the measurement error variance. An exemplary time step would 1 second. The NIS plot follows chi-squared distribution with zero mean and variance $\alpha$. In one implementation, the consistency check is performed by checking whether the NIS sequence lies within a confidence bound which is computed as, $$\frac{(n-1)\sigma^2}{X^2_{n,1-\alpha}} < NIS < \frac{(n-1)\sigma^2}{X^2_{n,\alpha}}$$

where $\sigma^2$ is the standard deviation of the NIS sequence, n−1=d.o.f. (degrees of freedom) of the chi-squared distribution, and $X_{n,\alpha}^2$ is the chosen chi value (unrelated to the X sigma points) for the confidence % a.

In step 450, the system is configured to check if NIS is within accepted confidence bounds (step 450) and, if NIS is not within the confidence bounds, then the module 340 is configured to update Q for the next time step as shown in step 455 of FIG. 4.

If the cycle is complete (see step 460) then the system is configured to end the process.

While this disclosure has been particularly shown and described with references to exemplary implementations thereof, it will be understood by those skilled in the art that various changes in form and details may be made therein without departing from the scope of the claimed implementations.

The following list is a non-limiting summary of the variables mentioned above, wherein state refers to the SOC:

$x_0$: initial state
$\hat{x}_0$: initial state (best estimate)
$P_0$: initial covariance matrix
k−1: current step
k: next step in time
$\hat{x}_{k-1}$: current state (best estimate)
$P_{k-1}$: current covariance matrix $x_{k-1}$: sigma points (current step)
$\lambda$: sigma point scaling parameter
$\alpha$: sigma point scaling parameter, spread of sigma points around
L: number of sigma points
n: number of states
$\hat{x}_k$: next state (best estimate)
$\tilde{x}$: mean of state
$X_k$: sigma points
$y_k$: predicted voltage
$V_{measured}$: cell voltage measured by sensor
K: Kalman gain
e: error in voltage prediction
$Q_{process}$: process noise covariance matrix
$S_k$: measurement error variance
$NIS_k$: normalized innovation squared
$V_{ocv,k}$: open circuit voltage of RC model
$I_k$: current of RC model
$R_{0,k}$: resistance of RC model (elements outside of the RC parallel circuit sections)
$R_{1,k}$: resistance of RC model ($1^{st}$ RC parallel circuit section)
$R_{2,k}$: resistance of RC model ($2^{nd}$ RC parallel circuit section)
$C_{1,k}$: capacitance of RC model ($1^{st}$ RC parallel circuit section)
$C_{2,k}$: capacitance of RC model ($2^{nd}$ RC parallel circuit section)
$V_{rc1,k}$: voltage of RC model ($1^{st}$ RC parallel circuit section)
$V_{rc2,k}$: voltage of RC model ($2^{nd}$ parallel circuit section)
$\tau_1$: time constant ($1^{st}$ RC parallel circuit section, $\tau_1 = R_1 * C_1$
$\tau^2$: variance of the sequence
$X_{1-\alpha}^2$: chi value for the confidence % $\alpha$

What is claimed is:

1. A computer-implemented method executed on data processing hardware causes the data processing hardware to perform comprising, at each time step of a plurality of time steps:
receiving battery parameters for a battery;
based on the received battery parameters for the battery:
determining an estimated voltage of the battery; and
determining an estimated state of charge (SOC) of the battery;
receiving a measured voltage of the battery;
determining a voltage error value based on the measured voltage of the battery and the estimated voltage of the battery;
correcting, using the voltage error, the estimated SOC to determine a corrected SOC for the battery;
operating the battery based on the corrected SOC;
determining an innovation sequence based on the voltage error and a measurement error variance;
determining the innovation sequence lies outside of upper and lower confidence bounds; and
determining an updated covariance error based on determining that the innovation sequence lies outside of the upper and lower confidence bounds.

2. The computer-implemented method of claim 1, wherein receiving the battery parameters for the battery comprises:
receiving an initial equivalent circuit current for the battery, an initial temperature of the battery, and an initial state of charge (SOC) of the battery; and
retrieving, from a look-up table, using the received initial equivalent circuit current for the battery, the initial temperature of the battery, and the initial SOC of the battery, the battery parameters for the battery.

3. The computer-implemented method of claim 1, wherein determining the estimated voltage of the battery and the estimated SOC of the battery comprises determining the estimated voltage and the estimated SOC using a resistor-capacitor (RC) equivalent circuit model of the battery.

4. The computer-implemented method of claim 3, wherein the battery parameters for the battery comprise at least one of:
an outside resistance associated with elements outside parallel sections of the RC equivalent circuit model;
a first resistance associated with a first parallel section of the RC equivalent circuit model;
a second resistance associated with a second parallel section of the RC equivalent circuit model;
a first capacitance associated with the first parallel section of the RC equivalent circuit model;
a second capacitance associated with the second parallel section of the RC equivalent circuit model; and
an open circuit voltage of the RC equivalent circuit model.

5. The computer-implemented method of claim 1, wherein determining the estimated SOC of the battery is further based on a corrected SOC of the battery determined during an immediately previous time step and a remaining capacity of the battery at the corresponding time step.

6. The computer-implemented method of claim 1, wherein correcting the estimated SOC to determine the corrected SOC for the battery further uses a Kalman gain applied to the voltage error.

7. The computer-implemented method of claim 1, wherein the innovation sequence comprises a normalized innovation squared sequence.

8. The computer-implemented method of claim 1, wherein operating the battery based on the corrected SOC comprises operating the battery based on the corrected SOC to provide power to one or more electric motors in communication with the battery.

9. The computer-implemented method of claim 1, wherein receiving the measured voltage of the battery comprises receiving the measured voltage from a sensor.

10. A vehicle comprising:
wheels;
one or more electric motors for driving rotation of the wheels;
a battery configured to provide power to the one or more electric motors; and
a battery management system comprising a microprocessor, the microprocessor performing operations comprising, at each time step of a plurality of time steps:
receiving battery parameters for the battery;
based on the received battery parameters for the battery:
determining an estimated voltage of the battery; and
determining an estimated state of charge (SOC) of the battery;
receiving a measured voltage of the battery;
determining a voltage error value based on the measured voltage of the battery and the estimated voltage of the battery;
correcting, using the voltage error, the estimated SOC to determine a corrected SOC for the battery;
operating the battery based on the corrected SOC;
determining an innovation sequence based on the voltage error and a measurement error variance;

determining the innovation sequence lies outside of upper and lower confidence bounds; and determining an updated covariance error based on determining that the innovation sequence lies outside of the upper and lower confidence bounds.

11. The vehicle of claim 10, wherein receiving the battery parameters for the battery comprises:

receiving an initial equivalent circuit current for the battery, an initial temperature of the battery, and an initial state of charge (SOC) of the battery; and retrieving, from a look-up table, using the received initial equivalent circuit current for the battery, the initial temperature of the battery, and the initial SOC of the battery, the battery parameters for the battery.

12. The vehicle of claim 10, wherein determining the estimated voltage of the battery and the estimated SOC of the battery comprises determining the estimated voltage and the estimated SOC using a resistor-capacitor (RC) equivalent circuit model of the battery.

13. The vehicle of claim 12, wherein the battery parameters for the battery comprise at least one of:

an outside resistance associated with elements outside parallel sections of the RC equivalent circuit model;

a first resistance associated with a first parallel section of the RC equivalent circuit model;

a second resistance associated with a second parallel section of the RC equivalent circuit model;

a first capacitance associated with the first parallel section of the RC equivalent circuit model;

a second capacitance associated with the second parallel section of the RC equivalent circuit model; and an open circuit voltage of the RC equivalent circuit model.

14. The vehicle of claim 10, wherein determining the estimated SOC of the battery is further based on a corrected SOC of the battery determined during an immediately previous time step and a remaining capacity of the battery at the corresponding time step.

15. The vehicle of claim 10, wherein correcting the estimated SOC to determine the corrected SOC for the battery further uses a Kalman gain applied to the voltage error.

16. The vehicle of claim 10, wherein the innovation sequence comprises a normalized innovation squared sequence.

17. The vehicle of claim 10, wherein operating the battery based on the corrected SOC comprises operating the battery based on the corrected SOC to provide power to the one or more electric motors in communication with the battery.

18. The vehicle of claim 10, further comprising:

a sensor configured to measure voltage of the battery, wherein receiving the measured voltage of the battery comprises receiving the measured voltage from the sensor.

* * * * *